United States Patent
Yamaguchi et al.

(10) Patent No.: US 10,692,934 B2
(45) Date of Patent: Jun. 23, 2020

(54) MEMORY DEVICE

(71) Applicant: Toshiba Memory Corporation, Minato-ku, Tokyo (JP)

(72) Inventors: Marina Yamaguchi, Yokkaichi Mie (JP); Shoichi Kabuyanagi, Yokkaichi Mie (JP); Masumi Saitoh, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/352,534

(22) Filed: Mar. 13, 2019

(65) Prior Publication Data
US 2020/0083292 A1   Mar. 12, 2020

(30) Foreign Application Priority Data
Sep. 11, 2018  (JP) .................. 2018-170010

(51) Int. Cl.
*H01L 27/24* (2006.01)
*H01L 45/00* (2006.01)
(Continued)

(52) U.S. Cl.
CPC ........ *H01L 27/249* (2013.01); *G11C 13/0007* (2013.01); *H01L 23/528* (2013.01); *H01L 45/08* (2013.01); *H01L 45/1233* (2013.01); *H01L 45/1253* (2013.01); *H01L 45/146* (2013.01); *G11C 2213/15* (2013.01); *G11C 2213/32* (2013.01); *G11C 2213/52* (2013.01); *G11C 2213/71* (2013.01)

(58) Field of Classification Search
CPC ... H01L 45/1233; H01L 45/14; H01L 45/146; H01L 45/147; H01L 27/249; G11C 13/0007; G11C 13/0011
See application file for complete search history.

(56) References Cited

U.S. PATENT DOCUMENTS 9,754,665 B2 * 9/2017 Chen ................... H01L 27/249
10,522,596 B2 * 12/2019 Sawa .................. H01L 45/1683
(Continued)

FOREIGN PATENT DOCUMENTS

JP         3989506 B2    10/2007
JP     2008-243913 A    10/2008
(Continued)

*Primary Examiner* — Allison Bernstein
(74) *Attorney, Agent, or Firm* — Foley & Lardner LLP

(57) ABSTRACT

According to one embodiment, a memory device includes a first conductive layer, a second conductive layer, and a first layer. A direction from the first conductive layer toward the second conductive layer is aligned with a first direction. The first layer is provided between the first conductive layer and the second conductive layer. The first layer includes a first region including titanium and oxygen, a second region including aluminum and oxygen and being provided between the first conductive layer and the first region, and a third region including aluminum and oxygen and being provided between the first region and the second conductive layer. A surface area in a first plane of a brookite region included in the first region is 58 percent or more of a surface area in the first plane of the first region. The first plane crosses the first direction.

18 Claims, 8 Drawing Sheets

(51) Int. Cl.
*H01L 23/528* (2006.01)
*G11C 13/00* (2006.01)

(56) References Cited

U.S. PATENT DOCUMENTS

| | | |
|---|---|---|
| 2008/0048164 A1 | 2/2008 | Odagawa |
| 2009/0097300 A1 | 4/2009 | Ishihara |
| 2009/0236581 A1 | 9/2009 | Yoshida |
| 2011/0096595 A1 | 4/2011 | Terai |
| 2017/0346006 A1 | 11/2017 | Nabatame |
| 2018/0269390 A1 | 9/2018 | Saitoh |

FOREIGN PATENT DOCUMENTS

| | | |
|---|---|---|
| JP | 4973666 B2 | 7/2012 |
| JP | 2018-157068 A | 10/2018 |

\* cited by examiner

MEMORY DEVICE

CROSS-REFERENCE TO RELATED APPLICATIONS

This application is based upon and claims the benefit of priority from Japanese Patent Application No. 2018-170010, filed on Sep. 11, 2018; the entire contents of which are incorporated herein by reference.

FIELD

Embodiments described herein relate generally to a memory device.

BACKGROUND

For example, there is a memory device that uses a titanium oxide layer. Stable operations of the memory device are desirable.

DETAILED DESCRIPTION

Figure 1:
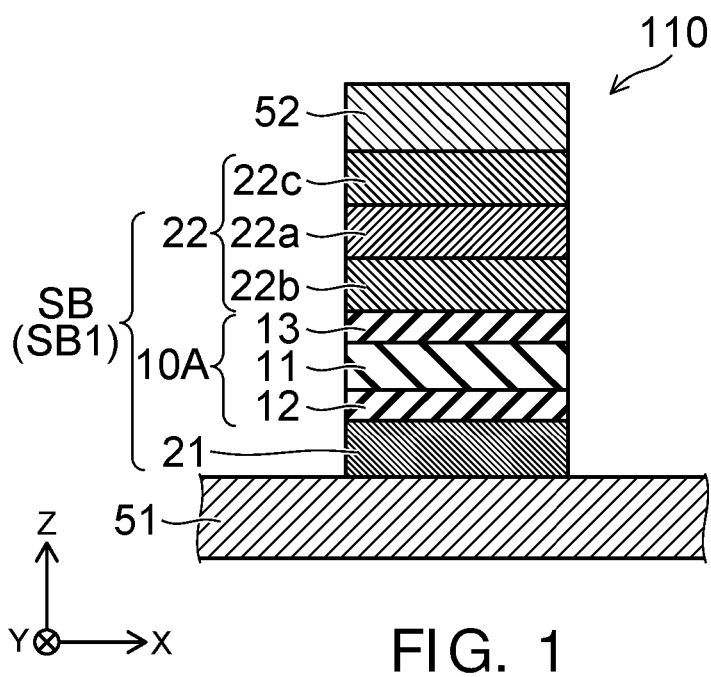
FIG. 1 is a schematic cross-sectional view illustrating a memory device according to a first embodiment.

According to one embodiment, a memory device includes a first conductive layer, a second conductive layer, and a first layer. A direction from the first conductive layer toward the second conductive layer is aligned with a first direction. The first layer is provided between the first conductive layer and the second conductive layer. The first layer includes a first region including titanium and oxygen, a second region including aluminum and oxygen and being provided between the first conductive layer and the first region, and a third region including aluminum and oxygen and being provided between the first region and the second conductive layer. A surface area in a first plane of a brookite region included in the first region is 58 percent or more of a surface area in the first plane of the first region. The first plane crosses the first direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating a memory device according to a first embodiment.

As shown in FIG. 1, the memory device 110 according to the embodiment includes a first conductive layer 21, a second conductive layer 22, and a first layer 10A. The first layer 10A is provided between the first conductive layer 21 and the second conductive layer 22. The direction from the first conductive layer 21 toward the second conductive layer 22 is aligned with a first direction. The first conductive layer 21, the second conductive layer 22, and the first layer 10A are included in a stacked body SB (e.g., a first stacked body SB1).

The first direction is taken as a Z-axis direction. One direction perpendicular to the Z-axis direction is taken as an X-axis direction. One direction perpendicular to the Z-axis direction and the X-axis direction is taken as a Y-axis direction. The Z-axis direction corresponds to the stacking direction of the stacked body SB.

A first interconnect 51 and a second interconnect 52 are provided in the example. The stacked body SB (the first stacked body SB1) is provided between the first interconnect 51 and the second interconnect 52. For example, the first conductive layer 21 is provided between the first interconnect 51 and the second interconnect 52. The second conductive layer 22 is provided between the first conductive layer 21 and the second interconnect 52.

In one example, the first conductive layer 21 includes, for example, polysilicon. The polysilicon may include, for example, phosphorus (P) or the like as an impurity. Good conductivity is obtained by such an element being included in the polysilicon. The thickness (the length along the Z-axis direction) of the first conductive layer 21 is, for example, not less than 10 nm and not more than 30 nm.

The second conductive layer 22 includes, for example, a metal layer 22a. The metal layer 22a may include, for example, at least one selected from the group consisting of titanium, tungsten, and tantalum, etc. In the example, the metal layer 22a is a Ti layer. The thickness (the length along the Z-axis direction) of the metal layer 22a is, for example, not less than 3 nm and not more than 10 nm.

In the example, the second conductive layer 22 further includes compound layers 22b and 22c. The compound layer 22b is provided between the compound layer 22c and the first layer 10A. The metal layer 22a is provided between the compound layer 22c and the compound layer 22b. In one example, the compound layers 22b and 22c include compounds. For example, the compounds include a metal included in the metal layer 22a. In the case where the metal layer 22a is a titanium layer, the compound layers 22b and 22c include, for example, TiN layers. The thicknesses (the lengths along the Z-axis direction) of the compound layers 22b and 22c each are, for example, not less than 3 nm and not more than 10 nm.

The first layer 10A includes first to third regions 11 to 13. The first region 11 includes titanium and oxygen. The second region 12 is provided between the first conductive layer 21 and the first region 11. The second region 12 includes aluminum and oxygen. The third region 13 is provided between the first region 11 and the second conductive layer 22. The third region 13 includes aluminum and oxygen.

The first layer 10A is, for example, an oxide layer. In the first layer 10A, the first region 11 is a titanium-rich region. The second region 12 is an aluminum-rich region. The third region 13 is an aluminum-rich region. At least a portion of the first region 11 may include $TiO_2$.

The electrical resistance of the first layer 10A changes. The first layer 10A functions as a variable resistance layer. The first layer 10A has a first state and a second state. A first electrical resistance between the first conductive layer 21 and the second conductive layer 22 in the first state is lower than a second electrical resistance between the first conductive layer 21 and the second conductive layer 22 in the second state. For example, the first layer 10A is set to the first state (a low resistance state) when a first voltage (e.g., a set voltage) is applied between the first conductive layer 21 and the second conductive layer 22. For example, the first layer 10A is set to the second state (a high resistance state) when a second voltage (e.g., a reset voltage) is applied between the first conductive layer 21 and the second conductive layer 22. For example, the polarity of the second voltage is different from the polarity of the first voltage. For example, it is considered that these two states are due to the state of the conductive path formed in the first layer 10A. For example, the conductive path may include oxygen vacancies.

The first state and the second state that have mutually-different electrical resistances correspond to information that is stored. For example, the stacked body SB (the first stacked body SB1) functions as one memory cell. In the memory device, for example, the switching of the low resistance state/high resistance state corresponds to a storage operation or an erase operation.

In the memory device, it was found that there are cases where it is difficult to obtain the desired state when the storage operation or the erase operation is performed repeatedly. For example, when applying the set voltage for the set operation, there are cases where the resistance becomes excessively low; and breakdown of the element occurs (set breakdown occurs). When set breakdown occurs, for example, the desired high resistance state cannot be obtained.

In the embodiment as described below, the first region 11 includes a region (a brookite region) having a brookite crystal structure. For example, the proportion of the brookite region in the first region 11 is higher than the proportion of regions of other crystal types in the first region 11.

As described below, it was found that the set breakdown recited above can be suppressed in the embodiment. According to the embodiment, for example, the breakdown voltage can be increased. According to the embodiment, a stable reprogram operation is obtained. For example, a memory device can be provided in which the operations can be stable.

In one example, the length in the X-axis direction of the stacked body SB is, for example, not less than 5 nm and not more than 100 nm. The length in the Y-axis direction of the stacked body SB is, for example, not less than 5 nm and not more than 100 nm. For example, these lengths correspond to the size of one memory cell.

To form the stacked body SB, for example, a stacked film that has a large surface area is formed. The stacked film includes a film used to form the first conductive layer 21, a film used to form the second conductive layer 22, and a film used to form the first layer 10A. The stacked body SB (the first stacked body SB1) is obtained by patterning the stacked film having the large surface area.

An example of characteristics of the memory device according to the embodiment will now be described.

Figure 2:
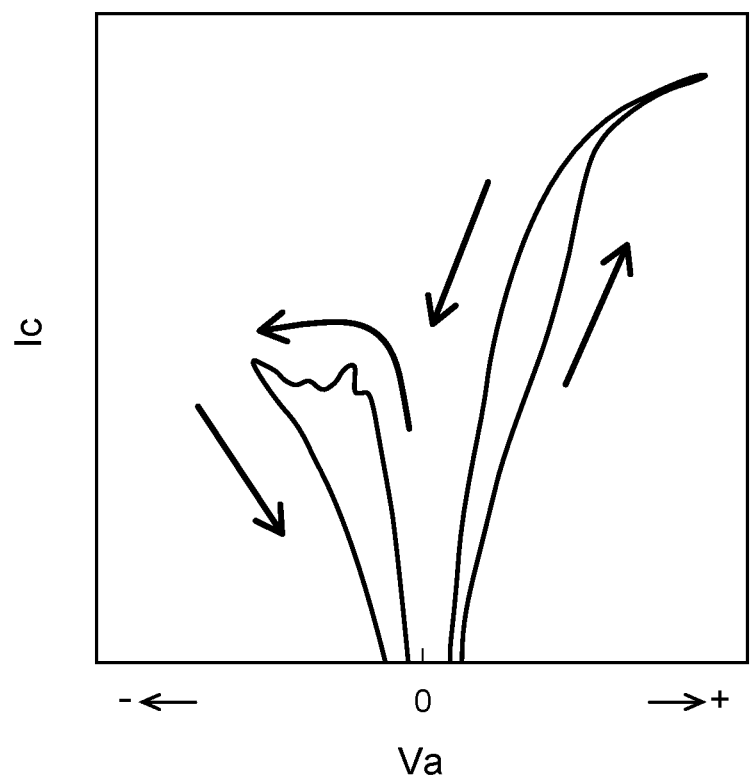
FIG. 2 is a graph illustrating the characteristics of the memory device according to the first embodiment.

FIG. 2 is a graph illustrating the characteristics of the memory device according to the first embodiment.

The horizontal axis of FIG. 2 corresponds to a voltage Va applied between the first conductive layer 21 and the second conductive layer 22. The vertical axis corresponds to a current Ic (logarithm) flowing between the first conductive layer 21 and the second conductive layer 22.

As shown in FIG. 2, the current Ic changes along multiple curves as the voltage Va increases and decreases. For example, the current Ic has hysteresis. For one voltage, the state in which the current Ic is large corresponds to the first state (the low resistance state). For the one voltage, the state in which the current Ic is small corresponds to the second state (the high resistance state).

A reprogram cycle test is performed for the stacked body SB having such characteristics. In the reprogram cycle test, the operation of one cycle including the set operation and the reset operation is performed repeatedly multiple times.

An example of the set breakdown occurring due to the multiple repetition will now be described.

Figure 3:
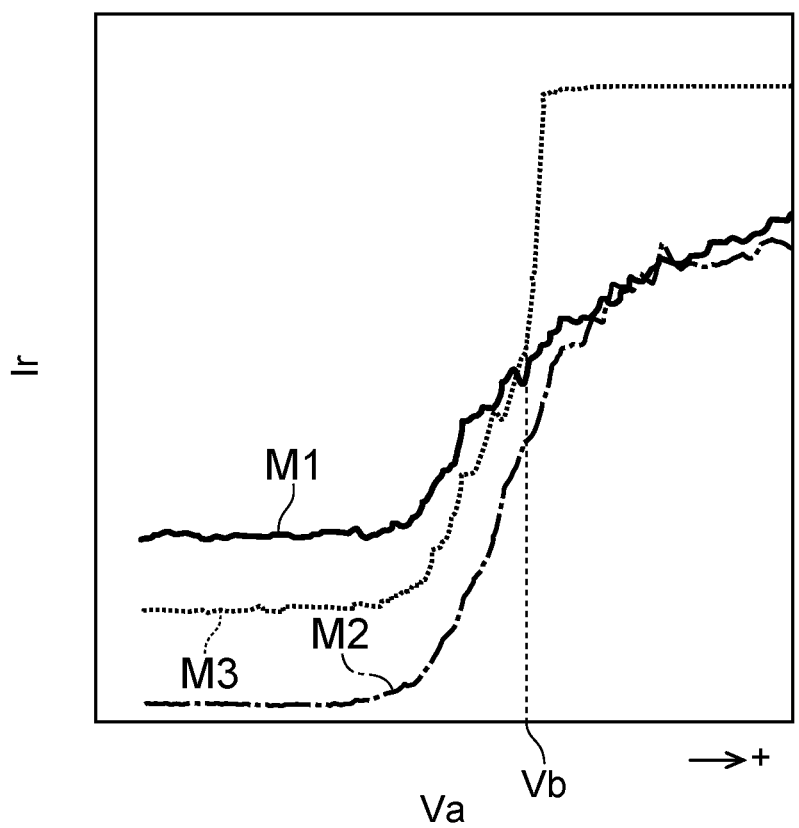
FIG. 3 is a graph illustrating characteristics of the memory device.

FIG. 3 is a graph illustrating characteristics of the memory device.

An example of the characteristics of three set operations is shown in FIG. 3. The horizontal axis of FIG. 3 corresponds to the voltage Va of the multiple set operations. The vertical axis corresponds to a current Ir (logarithm) flowing between the first conductive layer 21 and the second conductive layer 22. For example, the current Ir corresponds to a read current.

As shown in FIG. 3, in one cycle M1 among the multiple cycles, the current Ir increases gradually as the voltage Va increases. In another one cycle M2 among the multiple cycles as well, the current Ir increases gradually as the voltage Va increases. Conversely, in yet another one cycle M3 among the multiple cycles, when the voltage Va having a value Vb is applied, the current Ir increases abruptly and saturates. Set breakdown occurs in the cycle M3.

Such set breakdown occurs gradually in multiple memory cells. An example of the occurrence of the set breakdown when the reprogram cycle test is performed for multiple memory cells will now be described.

The results of a reprogram cycle test for first to third configurations will now be described.

In the first configuration, the first layer 10A (referring to FIG. 1) includes the first region 11, the second region 12, and the third region 13. The first region 11 includes titanium and oxygen. The thickness of the first region 11 is 5 nm. The second region 12 includes aluminum and oxygen. The thickness of the second region 12 is 2 nm. The third region 13 includes aluminum and oxygen. The thickness of the third region 13 is 1 nm.

In the second configuration, the first layer 10A includes the first region 11 and the second region 12; and the third region 13 is not provided. The conditions of the first region 11 and the second region 12 are the same as those of the first configuration.

In the third configuration as well, the first layer 10A includes the first region 11 and the second region 12; and the third region 13 is not provided. In the third configuration, the first region 11 includes titanium and oxygen; and the thickness of the first region 11 is 10 nm. The conditions of the second region 12 are the same as those of the first configuration.

The formation conditions of the second region 12 are the same between the first to third configurations. The formation conditions of the first region 11 are the same between the first configuration and the second configuration. Other than the thickness of the first region 11, the formation conditions of the first region 11 of the third configuration are the same as those of the first configuration and the second configuration.

Multiple memory cells that have the first configuration, multiple memory cells that have the second configuration, and multiple memory cells that have the third configuration were made. A reprogram cycle test was performed for these memory cells.

Figure 4A:
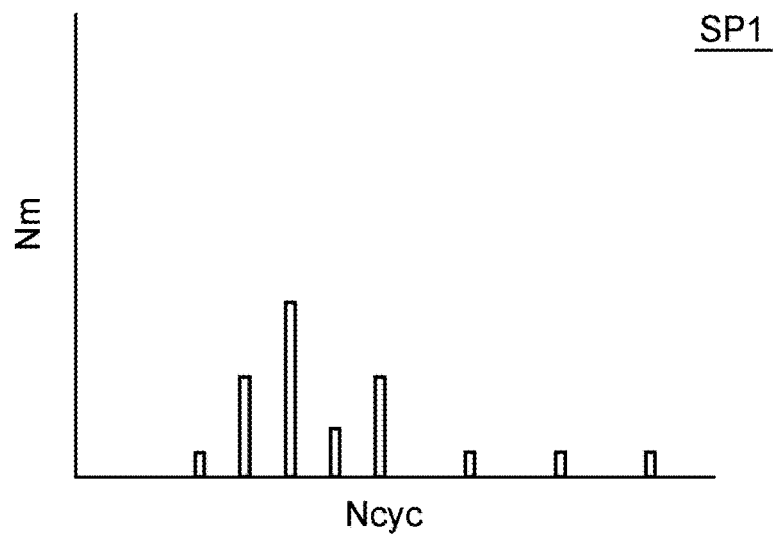
FIG. 4A to FIG. 4C are graphs illustrating characteristics of the memory device.
Figure 4B:
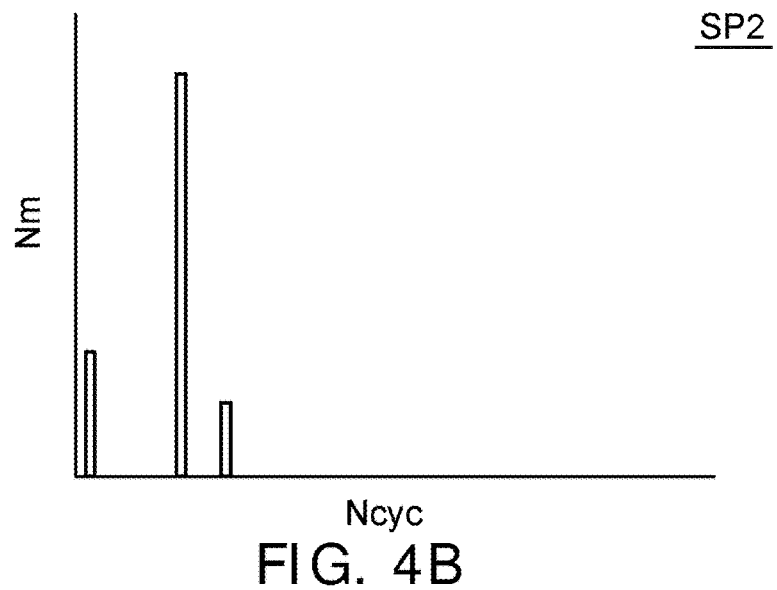
Figure 4C:
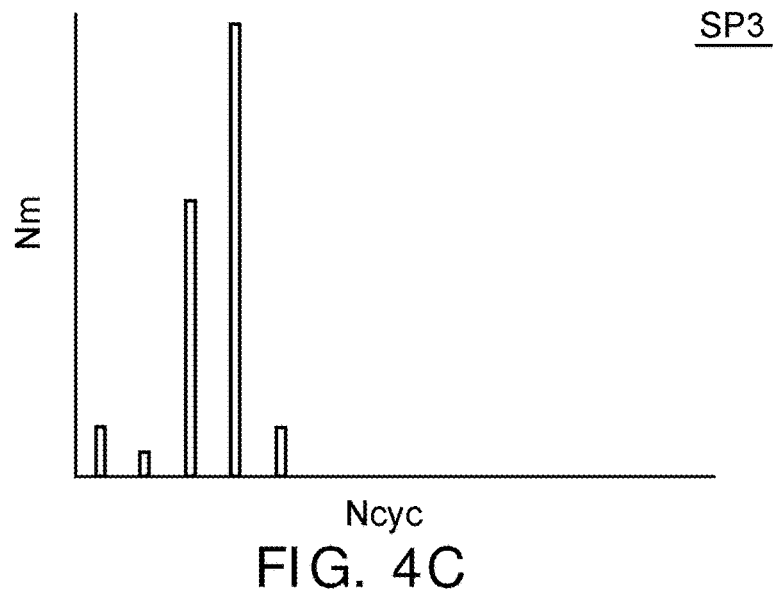

FIG. 4A to FIG. 4C are graphs illustrating characteristics of the memory device.

FIG. 4A to FIG. 4C correspond respectively to the first to third configurations recited above. In these figures, the horizontal axis is the range of a number of cycles Ncyc of the reprogram cycle test. The vertical axis is a number of memory cells Nm for which set breakdown occurred in the corresponding range of the number of cycles Ncyc.

For the second configuration SP2 as shown in FIG. 4B, the number of memory cells Nm for which set breakdown occurs is large when the number of cycles Ncyc is small. For the second configuration SP2, the number of memory cells for which a stable reprogram operation is obtained is small when the number of cycles Ncyc is large.

For the third configuration SP3 as shown in FIG. 4C, compared to the second configuration SP2, the number of memory cells Nm for which set breakdown occurs is small when the number of cycles Ncyc is small. The number of memory cells for which normal operations are obtained is larger for the third configuration SP3 than for the second configuration SP2. Compared to the second configuration SP2, the set breakdown is suppressed for the third configuration SP3.

Conversely, for the first configuration SP1 as shown in FIG. 4A, the number of memory cells Nm for which set breakdown occurs is small when the number of cycles Ncyc is small. The number of memory cells for which normal operations are obtained is larger for the first configuration SP1 than for the second configuration SP2 and the third configuration SP3. Compared to the third configuration SP3, the set breakdown is suppressed further for the first configuration SP1.

The thickness of the first region 11 in the third configuration SP3 (10 nm) is thicker than the thickness of the first region 11 in the second configuration SP2 (5 nm). It is considered that the set breakdown is suppressed in the case where the first region 11 is thick. It is considered that this is caused by the electric field applied to the first region 11 decreasing as the thickness of the first region 11 increases. However, for example, the operating voltage becomes excessively high in the case where the first region 11 is excessively thick. Further, if the first region 11 is excessively thick, the thickness of the entirety becomes thick in the case where the stacked bodies SB are multiply provided and the multiple stacked bodies are stacked with each other. It is difficult to obtain high patterning precision.

Conversely, for the first configuration SP1, the thickness of the first region 11 (5 nm) is the same as the thickness of the first region 11 of the second configuration SP2 (5 nm); and compared to the third configuration SP3, the set breakdown is suppressed further by providing the thin third region 13 (1 nm). Even in the case where the first region 11 of the first configuration SP1 is thin, the set breakdown can be suppressed effectively by providing the first region 11 between the second region 12 and the third region 13.

It is difficult to explain the effective suppression of the set breakdown in the first configuration SP1 using only the effects of the thickness. It is considered that the suppression of the set breakdown is related to a special crystal structure inside the structure in which the first region 11 is provided between the second region 12 and the third region 13. Or, it is considered that the suppression of the set breakdown is related to the special profiles of the elements in the first to third regions 11 to 13.

An example of evaluation results of the crystal structures and the profiles of the elements will now be described.

An example of evaluation results is described also for a fourth configuration in addition to the first to third configurations SP1 to SP3 recited above. In the fourth configuration, similarly to the first configuration SP1, the first layer 10A (referring to FIG. 1) includes the first region 11, the second region 12, and the third region 13. The first region 11 includes titanium and oxygen. In the fourth configuration, the thickness of the first region 11 is 10 nm. In the fourth configuration, the second region 12 and the third region 13 are similar to those of the first configuration SP1.

An example of analysis results of electron back scatter diffraction (EBSD) and analysis results of transmission electron microscopy (TEM)-electron energy-loss spectroscopy (EELS) of stacked films having the first to fourth configurations will now be described.

In the analysis, the stacked films have surface areas that are larger than the size of the memory cell without the stacked films being patterned into the memory cells. As described above, the multiple memory cells (the stacked bodies SB) are obtained by patterning the stacked film after the formation of the stacked film. Heat treatment at a high temperature is not performed after the patterning; therefore, it is considered that the evaluation results for the large surface area correspond to the characteristics of the small memory cell after the patterning.

FIG. 5 to FIG. 8 are schematic views illustrating the characteristics of the memory device.

FIG. 5 to FIG. 8 respectively show images of the EBSD analysis of the samples of the first to fourth configurations SP1 to SP4. These figures illustrate the crystal types in the X-Y plane of the samples. The X-Y plane corresponds to a first plane crossing the first direction (the Z-axis direction). For example, the first plane is perpendicular substantially to the first direction. One side in these figures is about 4 μm.

In these figures, the multiple regions that have mutually-different concentrations in the figures correspond to the multiple crystal types. In these figures, the regions that correspond to anatase, the regions that correspond to rutile, and the regions that correspond to brookite are shown as bright and dark in the figures. The darkest regions (the black regions) in the figures correspond to amorphous regions or regions where it is impossible to identify the crystallinity. In each of the multiple crystal regions shown in these figures, the orientation of the crystal has one orientation (e.g., uniaxiality). For example, the orientations of the crystals between the multiple crystal regions are random.

Figure 5:
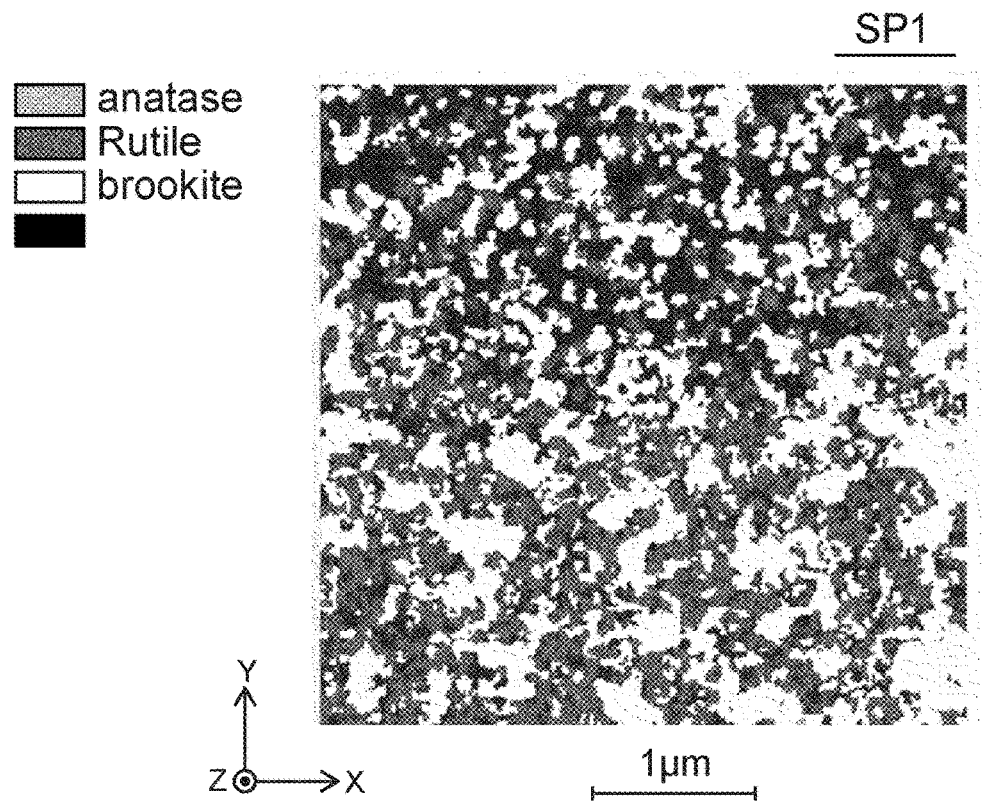
FIG. 5 is a schematic view illustrating the characteristics of the memory device.
Figure 6:
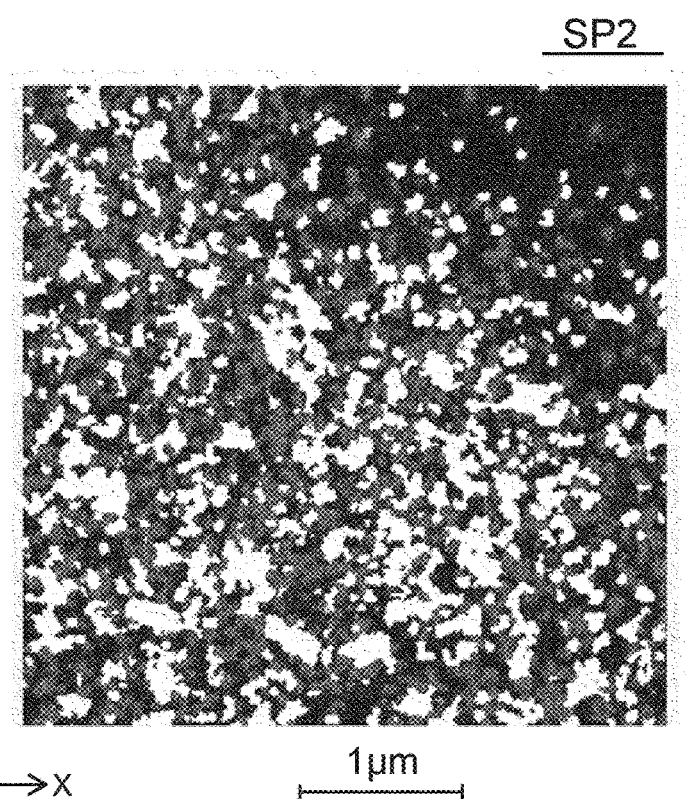
FIG. 6 is a schematic view illustrating the characteristics of the memory device.

Comparing FIG. 5 (the first configuration SP1) and FIG. 6 (the second configuration SP2), it can be seen that there is more brookite in the first configuration SP1 than in the second configuration SP2.

In the first configuration SP1 (FIG. 5), the proportion (the proportion of the surface area) of anatase in the entirety is 0.003. In the first configuration SP1, the proportion of rutile in the entirety is 0.396. In the first configuration SP1, the proportion of brookite in the entirety is 0.601.

In the second configuration SP2 (FIG. 6), the proportion (the proportion of the surface area) of anatase in the entirety is 0.005. In the second configuration SP2, the proportion of rutile in the entirety is 0.431. In the second configuration SP2, the proportion of brookite in the entirety is 0.563.

Thus, for the first configuration SP1 for which the set breakdown can be suppressed, there are many brookite crystal regions compared to the regions of the other crystal types.

In the first configuration SP1, for example, the surface area (the total surface area) in the first plane (the X-Y plane) of the brookite region included in the first region 11 is 60.1% (percent) of the surface area in the first plane of the first region 11. On the other hand, in the second configuration SP2, the surface area (the total surface area) in the first plane of the brookite region included in the first region 11 is 56.3% of the surface area in the first plane of the first region 11.

In the embodiment, for example, the surface area (the total surface area) in the first plane of the brookite region included in the first region 11 is 58% or more of the surface area in the first plane of the first region 11. In the embodiment, the surface area (the total surface area) in the first plane of the brookite region included in the first region 11 may be 59% or more of the surface area in the first plane of the first region 11. Thereby, the set breakdown can be suppressed.

In the first configuration SP1, for example, the surface area (the total surface area) in the first plane (the X-Y plane) of the brookite region included in the first region 11 is 1.52 times the surface area (the total surface area) in the first plane of the rutile region included in the first region 11. On the other hand, in the second configuration SP2, the surface area (the total surface area) in the first plane of the brookite region included in the first region 11 is 1.30 times the surface area (the total surface area) in the first plane of the rutile region included in the first region 11.

In the embodiment, for example, it is favorable for the surface area (the total surface area) in the first plane (the X-Y plane) of the brookite region included in the first region 11 to be not less than 1.4 times the surface area (the total surface area) in the first plane of the rutile region included in the first region 11. In the embodiment, the surface area (the total surface area) in the first plane (the X-Y plane) of the brookite region included in the first region 11 may be not less than 1.45 times the surface area (the total surface area) in the first plane of the rutile region included in the first region 11. In the embodiment, the surface area recited above for the brookite region included in the first region 11 is greater than the surface area in the first plane recited above for the anatase region included in the first region 11. Thereby, the set breakdown can be suppressed.

In the embodiment, for example, the surface area in the first plane recited above for the rutile region included in the first region 11 is greater than the surface area in the first plane recited above for the anatase region included in the first region 11.

From the results of FIG. 5, it is derived that the average grain size in the first region 11 is not less than 90 nm and not more than 110 nm in the first configuration SP1. From the results of FIG. 6, it is derived that the average grain size in the first region 11 is about 80 nm in the second configuration SP2.

It is considered that the amount (the density) of the interfaces included in the first region 11 is small when the average grain size is large. For example, it is considered that an irreversible current path forming at the interfaces is one cause of the set breakdown recited above. It is considered that the set breakdown can be suppressed by reducing the amount (the density) of the interfaces.

In the embodiment, it is favorable for the average grain size in the first region 11 to be 90 nm or more. Thereby, the set breakdown can be suppressed easily.

Figure 7:
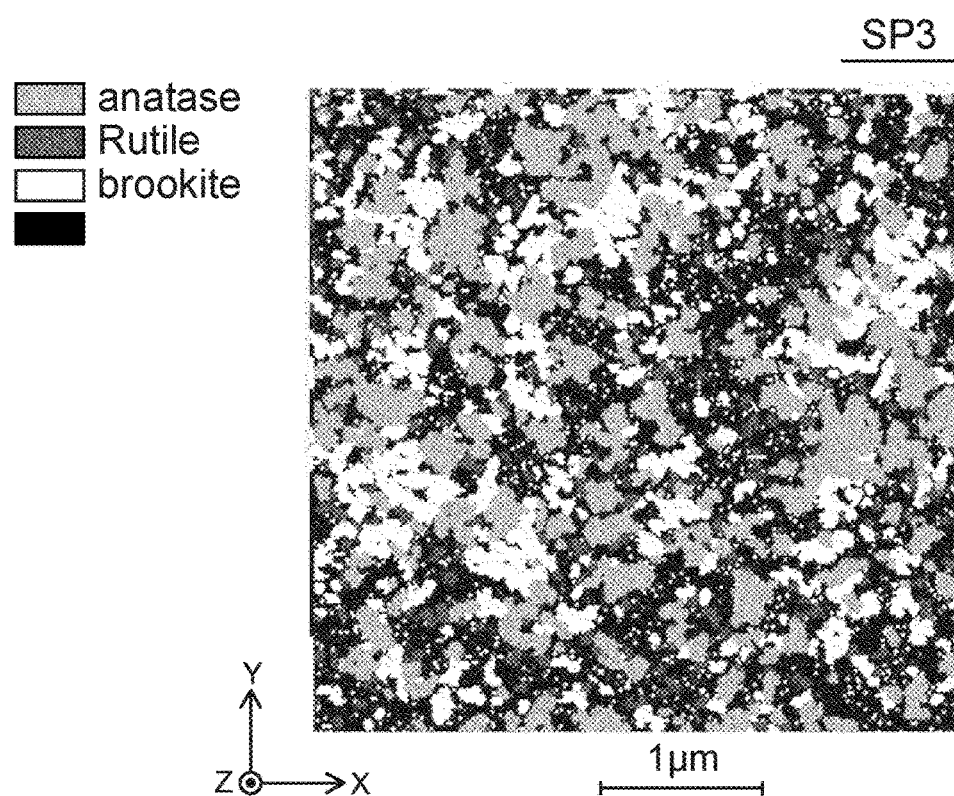
FIG. 7 is a schematic view illustrating the characteristics of the memory device.

As shown in FIG. 7, there is much anatase in the third configuration SP3. The proportion (the proportion of the surface area) of anatase in the entirety is 0.493. In the third configuration SP3, the proportion of rutile in the entirety is 0.116. In the third configuration SP3, the proportion of brookite in the entirety is 0.391. From the results of FIG. 7, it is derived that the average grain size in the first region 11 is about 160 nm in the third configuration SP3.

Figure 8:
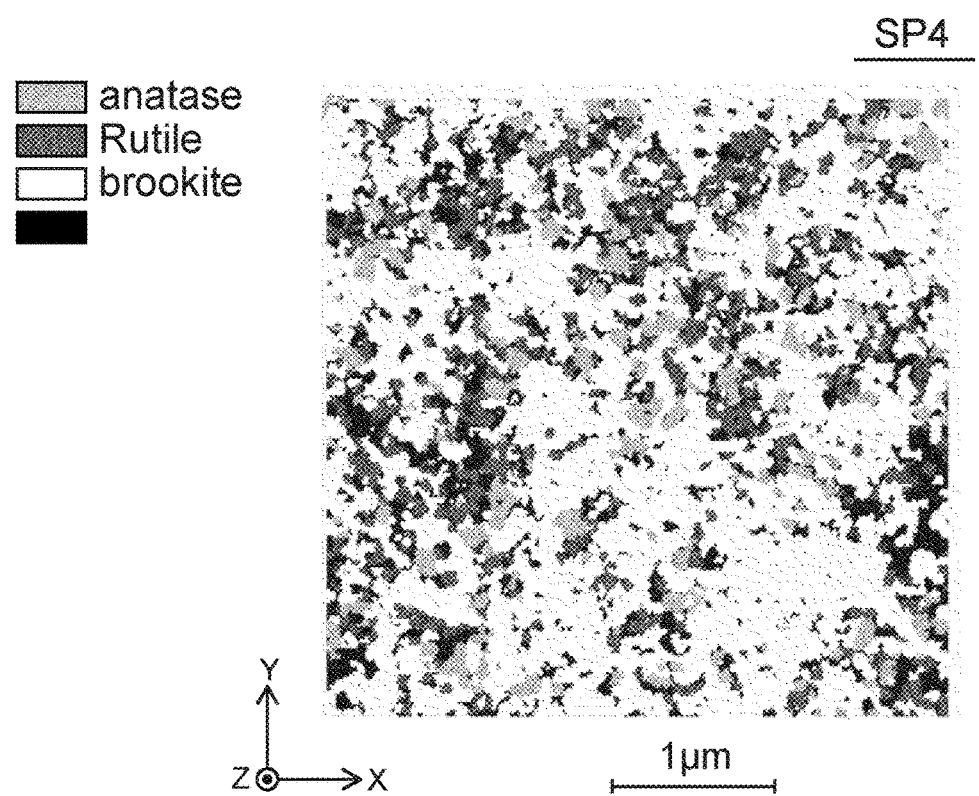
FIG. 8 is a schematic view illustrating the characteristics of the memory device.

On the other hand, as shown in FIG. 8, there is much brookite in the fourth configuration SP4. The proportion (the proportion of the surface area) of anatase in the entirety is 0.117. In the fourth configuration SP4, the proportion of rutile in the entirety is 0.161. In the fourth configuration SP4, the proportion of brookite in the entirety is 0.723. From the results of FIG. 8, it is derived that the average grain size in the first region 11 is about 380 nm in the fourth configuration SP4.

As described above, the thickness of the first region 11 is 10 nm in the third configuration SP3. Compared to the second configuration SP2 (FIG. 6) and the third configuration SP3 (FIG. 7), the average grain size is large when the thickness of the first region 11 is thick. Due to this effect, it is considered that the set breakdown can be suppressed for the third configuration SP3 (referring to FIG. 4C) compared to the second configuration SP2.

Generally, in the case where the first region 11 is thin, the effects of the interfaces between the first region 11 and the other regions are large. On the other hand, it is considered that in the case where the first region 11 is thick, the effects of the interface are small; and the bulk characteristics easily become pronounced. For example, as in the second configuration SP2, rutile easily becomes a major type when the first region 11 is thin in the case where one interface of the first region 11 is an interface with a region including aluminum and oxygen, and the other interface of the first region 11 is an interface with TiN. It is considered that rutile occurs easily when the effects of the interfaces are large. As in the third configuration SP3, anatase occurs easily when the first region 11 is thick in the case where one interface of the first region 11 is an interface with a region including aluminum and oxygen, and the other interface of the first region 11 is an interface with TiN. It is considered that anatase occurs easily when the bulk effects are large.

On the other hand, as described above, there are more brookite regions in the first configuration SP1 (FIG. 5) and the fourth configuration SP4 (FIG. 8). As in the first configuration SP1 and the fourth configuration SP4, it is considered that the brookite regions occur easily in the case where both of the interfaces of the first region 11 are interfaces with regions including aluminum and oxygen. Also, comparing the first configuration SP1 and the fourth configuration SP4, the average grain size is large when the first region 11 is thick.

Comparing the first configuration SP1 and the second configuration SP2, it is considered that the brookite regions occur and the average grain size is large in the case where both of the interfaces of the first region 11 are interfaces with regions including aluminum and oxygen.

It is considered that the set breakdown can be suppressed in the first configuration SP1 as an effect of the brookite regions occurring. Further, it is considered that the set breakdown is suppressed as an effect of the large average grain size.

As described above, the average grain size is large for the first configuration SP1 and the fourth configuration SP4 in which the brookite region is a major region. In these configurations, the average grain size is 90 nm or more. In such a case, the size (the length in the X-Y plane) of one memory cell may be not more than the average grain size. In such a case, in one example, a portion of one crystal grain may be included in one of the multiple memory cells; and another portion of the one crystal grain may be included in another one of the multiple memory cells.

In the embodiment, for example, the first configuration SP1, the fourth configuration SP4, or a configuration of a modification of the first configuration SP1 or the fourth configuration SP4 is applied. In the embodiment, in the case where the multiple memory cells (the multiple stacked bodies SB) are provided, there are many brookite regions in the first region 11 for at least half of the multiple memory cells.

For example, for at least half of the stacked bodies SB of the multiple stacked bodies SB, the surface area in the first plane (e.g., the X-Y plane) crossing the first direction (the Z-axis direction) of the brookite region included in the first region 11 is 58 percent or more of the surface area in the first plane recited above for the first region 11. In the embodiment, for the first region 11 for at least half of the stacked bodies SB of the multiple stacked bodies SB, the surface area in the first plane recited above for the brookite region included in the first region 11 may be 59 percent or more of the surface area in the first plane recited above.

Examples of the profiles of the elements for the first configuration SP1 and the second configuration SP2 will now be described.

Figure 9:
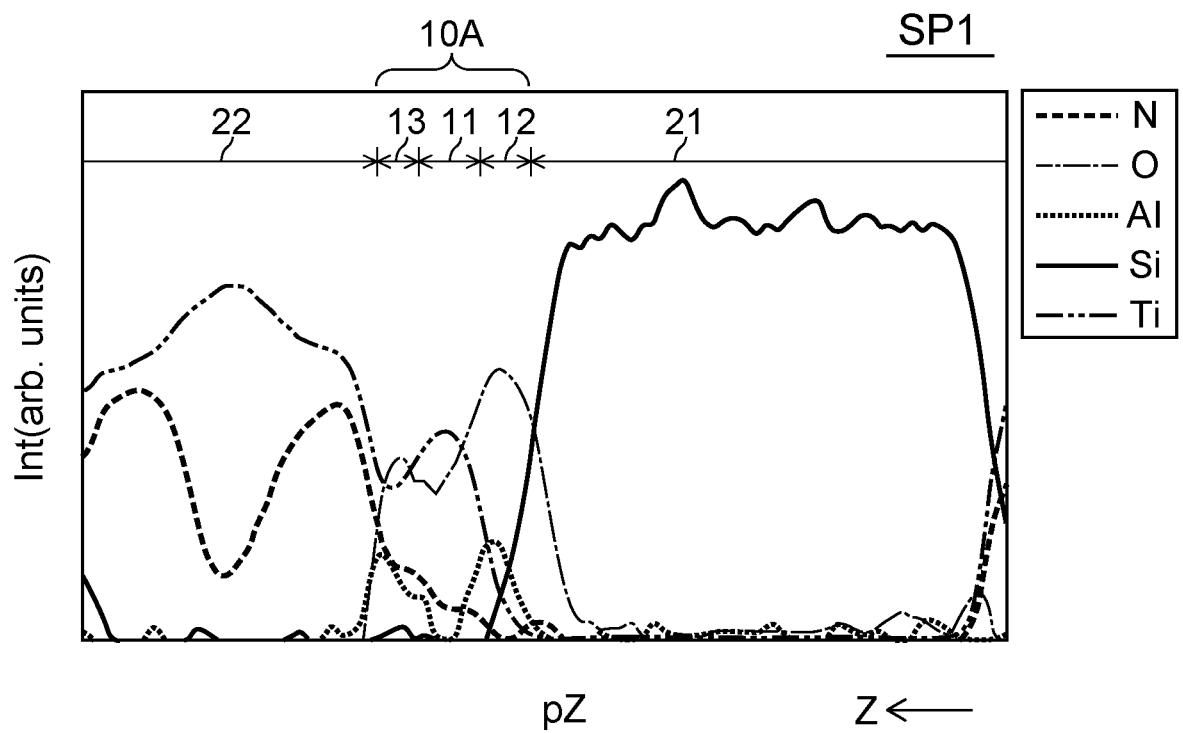
FIG. 9 is a graph illustrating the memory device.
Figure 10:
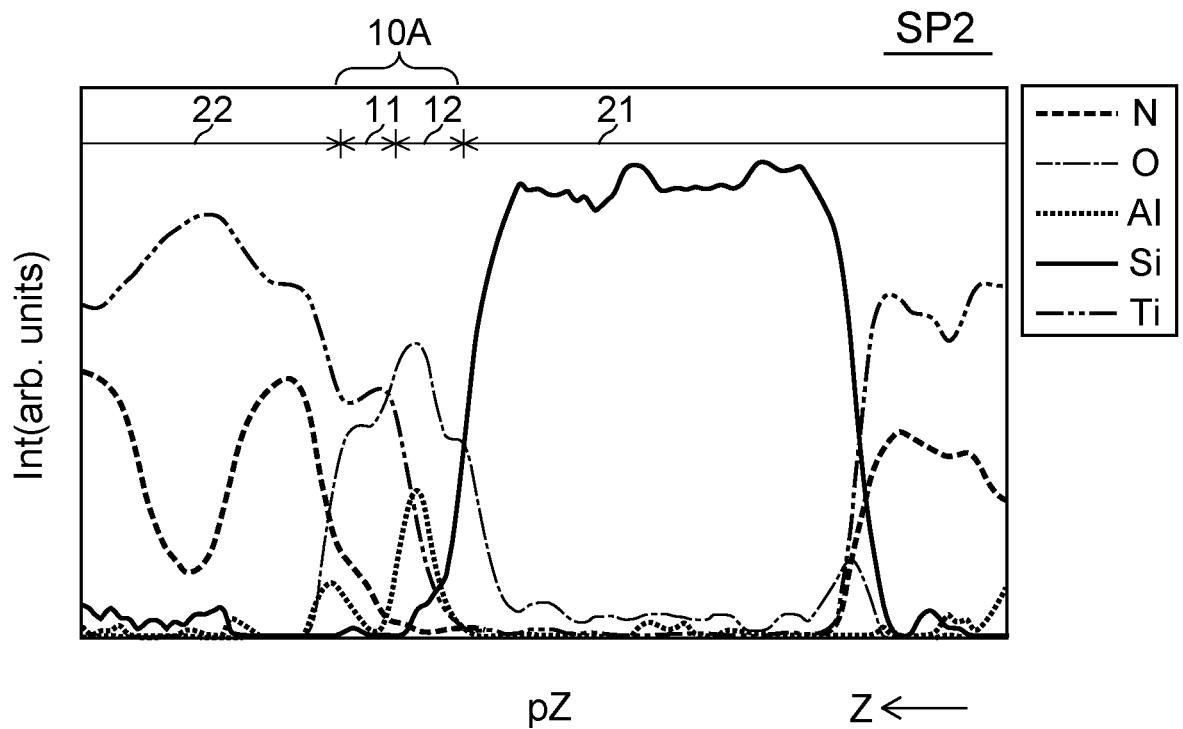
FIG. 10 is a graph illustrating the memory device.

FIG. 9 and FIG. 10 are graphs illustrating the memory device.

FIG. 9 corresponds to the first configuration SP1. FIG. 10 corresponds to the second configuration SP2. These figures illustrate the analysis results of transmission electron microscopy (TEM)-electron energy-loss spectroscopy (EELS). In these figures, the horizontal axis corresponds to a position pZ in the Z-axis direction. The vertical axis corresponds to an intensity Int (arbitrary units) of the obtained signal.

For the first configuration SP1 as shown in FIG. 9, two peaks relating to oxygen are observed in the region corresponding to the first layer 10A. The two peaks correspond to two regions (the second region 12 and the third region 13) including aluminum and oxygen. A peak of titanium occurs at the position pZ between the two peaks relating to oxygen. Further, two peaks relating to aluminum are observed in the region corresponding to the first layer 10A. The two peaks occur at a position where the position pZ is about 14 nm and a position where the position pZ is about 19.5 nm. It is considered that the peak at the position where the position pZ is about 14 nm corresponds to the third region 13. It is considered that the peak at the position where the position pZ is about 19.5 nm corresponds to the second region 12.

Conversely, for the second configuration SP2 as shown in FIG. 10, one peak relating to oxygen is observed in the region corresponding to the first layer 10A. For the second configuration SP2, two peaks relating to aluminum are observed even though the third region 13 is not formed. The two peaks occur at a position where the position pZ is about 14 nm and a position where the position pZ is about 18 nm. It is considered that the peak of aluminum at the position pZ of about 18 nm corresponds to the second region 12. On the other hand, it is considered that the peak of aluminum at the position pZ of about 14 nm is due to the aluminum diffusing (moving) from the second region 12. For the second configuration SP2, the height of the peak of aluminum at the position pZ of about 14 nm is not more than ½ of the height of the peak of aluminum occurring at the position where the position pZ is about 18 nm.

For the second configuration SP2 in which the third region 13 is not provided intentionally, the first region 11 is formed on the second region 12; and the second conductive layer 22 is formed on the first region 11. Subsequently, heat treatment is performed. In the initial stage of the heat treatment, there is no region including aluminum and oxygen between the first region 11 and the second conductive layer 22. The first region 11 is formed as the temperature increases in this state. It is considered that when the heat treatment has ended, aluminum collects due to the diffusion (the movement) to the portion of the first region 11 on the second conductive layer 22 side.

On the other hand, for the first configuration SP1 shown in FIG. 9, the first region 11 and the third region 13 are sequentially formed on the second region 12; and the second conductive layer 22 is formed on the third region 13. Subsequently, heat treatment is performed. Here as well, in the initial stage of the heat treatment, a region (the third region 13) that includes aluminum and oxygen is provided between the first region 11 and the second conductive layer 22. The first region 11 is formed as the temperature increases in this state. Therefore, an effect from the third region 13 acts on the first region 11 during the heat treatment.

As a result, it is considered that the difference occurs between the crystalline states described in reference to FIG. 5 and FIG. 6. Thereby, it is considered that the difference of the ease of the occurrence of the set breakdown occurs.

As shown in FIG. 9, two peaks relating to aluminum are observed in the region corresponding to the first layer 10A. The heights of the two peaks of aluminum are substantially the same. The height of one of the two peaks of aluminum is not less than 0.7 times and not more than 1.3 times the height of the other of the two peaks of aluminum. The height of the one of the two peaks of aluminum may be not less than 0.8 times and not more than 1.2 times the height of the other of the two peaks of aluminum.

As shown in FIG. 9, the second region 12 and the third region 13 may further include titanium in addition to aluminum and oxygen. The concentration of titanium in the third region 13 is higher than the concentration of titanium in the second region 12.

For example, the concentration of titanium at the position pZ of the peak of aluminum corresponding to the third region 13 is not less than 1.5 times the concentration of titanium at the position pZ of the peak of aluminum corresponding to the second region 12.

In the transmission electron microscopy-electron energy-loss spectroscopy analysis in the first direction (the Z-axis direction), the intensity of titanium in at least a portion of the second region 12 is lower than the intensity of aluminum in the at least a portion of the second region 12. In the analysis recited above, the intensity of titanium in at least a portion of the third region 13 is higher than the intensity of aluminum in the at least a portion of the third region 13.

For example, in the analysis recited above, the intensity of oxygen in the third region 13 is higher than the intensity of oxygen in the first region 11. For example, in the analysis recited above, the intensity of oxygen in the second region 12 is higher than the intensity of oxygen in the first region 11.

Second Embodiment

Figure 11A:
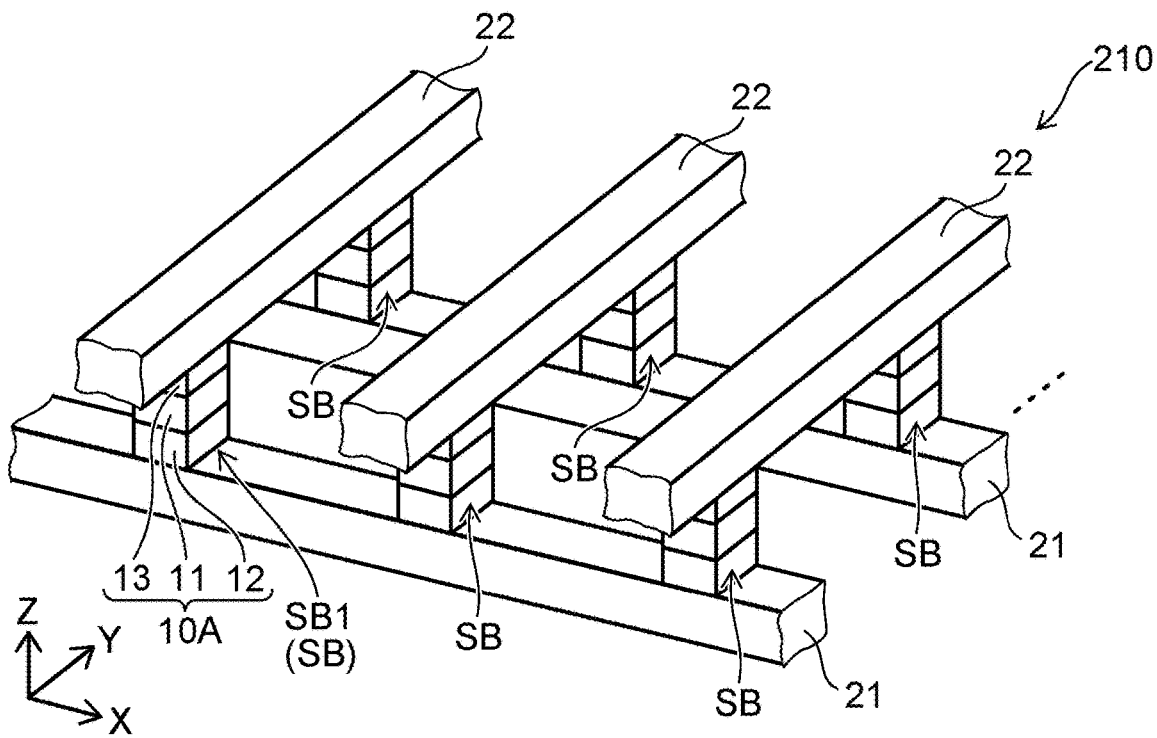
FIG. 11A and FIG. 11B are schematic perspective views illustrating memory devices according to a second embodiment.
Figure 11B:
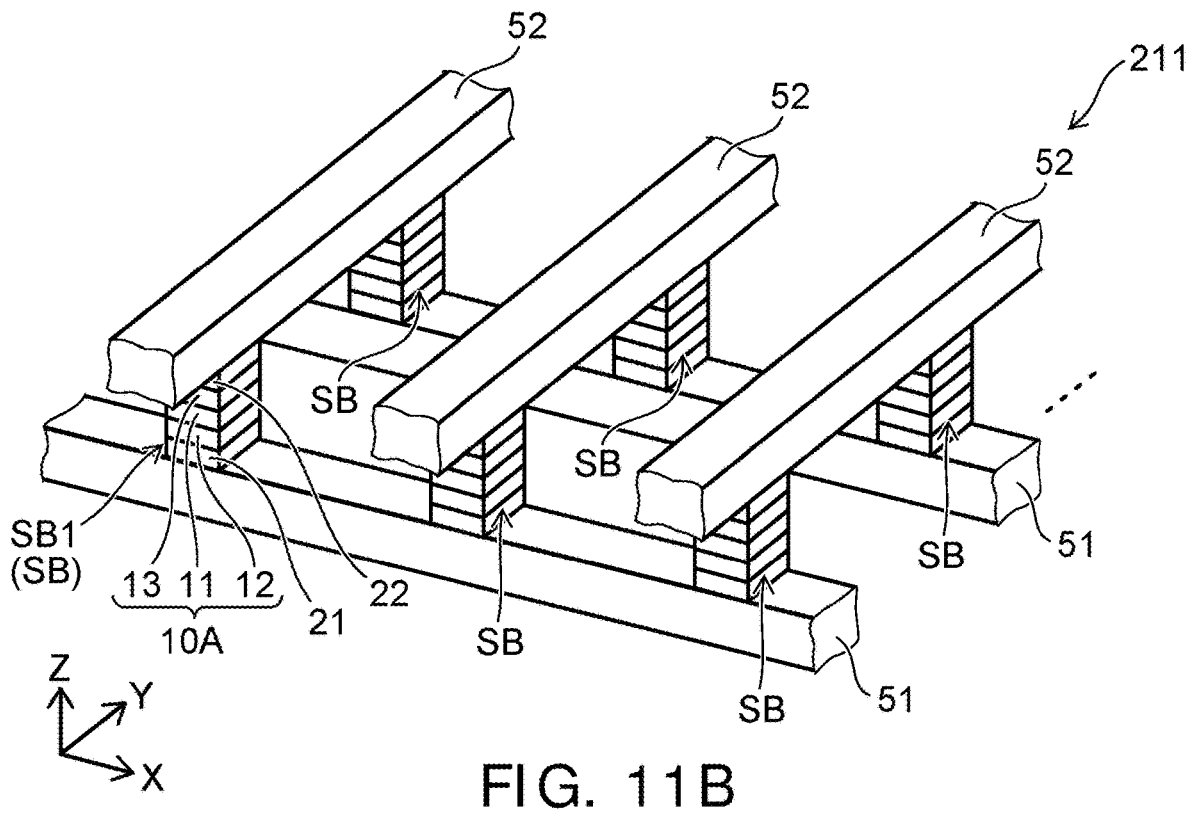

FIG. 11A and FIG. 11B are schematic perspective views illustrating memory devices according to a second embodiment.

In a memory device 210 as shown in FIG. 11A, the first conductive layer 21 extends along a second direction crossing the first direction (the Z-axis direction). In the example, the second direction is aligned with the X-axis direction. The second conductive layer 22 extends along a third direction crossing a plane (the Z-X plane) including the first direction (the Z-axis direction) and the second direction (the X-axis direction). In the example, the third direction is aligned with the Y-axis direction.

The multiple first conductive layers 21 are provided in the example. The first conductive layers 21 are arranged along the third direction recited above. The multiple second conductive layers 22 are provided. The second conductive layers 22 are arranged along the second direction. The multiple first layers 10A are provided. One of the multiple first layers 10A is provided between one of the multiple first conductive layers 21 and one of the multiple second conductive layers 22.

As shown in FIG. 11B, a memory device 211 includes the first interconnect 51 and the second interconnect 52. The first interconnect 51 extends along the second direction crossing the first direction (the Z-axis direction). In the example, the second direction is aligned with the X-axis direction. The second interconnect 52 extends along the third direction crossing a plane (the Z-X plane) including the first direction (the Z-axis direction) and the second direction (the X-axis direction). In the example, the third direction is aligned with the Y-axis direction. The first conductive layer 21 is provided between the first interconnect 51 and the second interconnect 52. The second conductive layer 22 is provided between the first conductive layer 21 and the second interconnect 52. The stacked body SB (the first stacked body SB1) that includes the first conductive layer 21, the second conductive layer 22, and the first layer 10A is provided between the first interconnect 51 and the second interconnect 52.

The multiple first interconnects 51 are provided in the example. The first interconnects 51 are arranged along the third direction recited above. The multiple second interconnects 52 are provided. The second interconnects 52 are arranged along the second direction. The multiple stacked bodies SB are provided. One of the multiple stacked bodies SB is provided between one of the multiple first interconnects 51 and one of the multiple second interconnects 52.

In the embodiment, the first interconnect 51 may be the first conductive layer 21. The second interconnect 52 may be the second conductive layer 22.

The multiple first layers 10A (or the multiple stacked bodies SB) are provided in the memory devices 210 and 211. The multiple first layers 10A (or the multiple stacked bodies SB) each function as one memory cell.

Figure 12A:
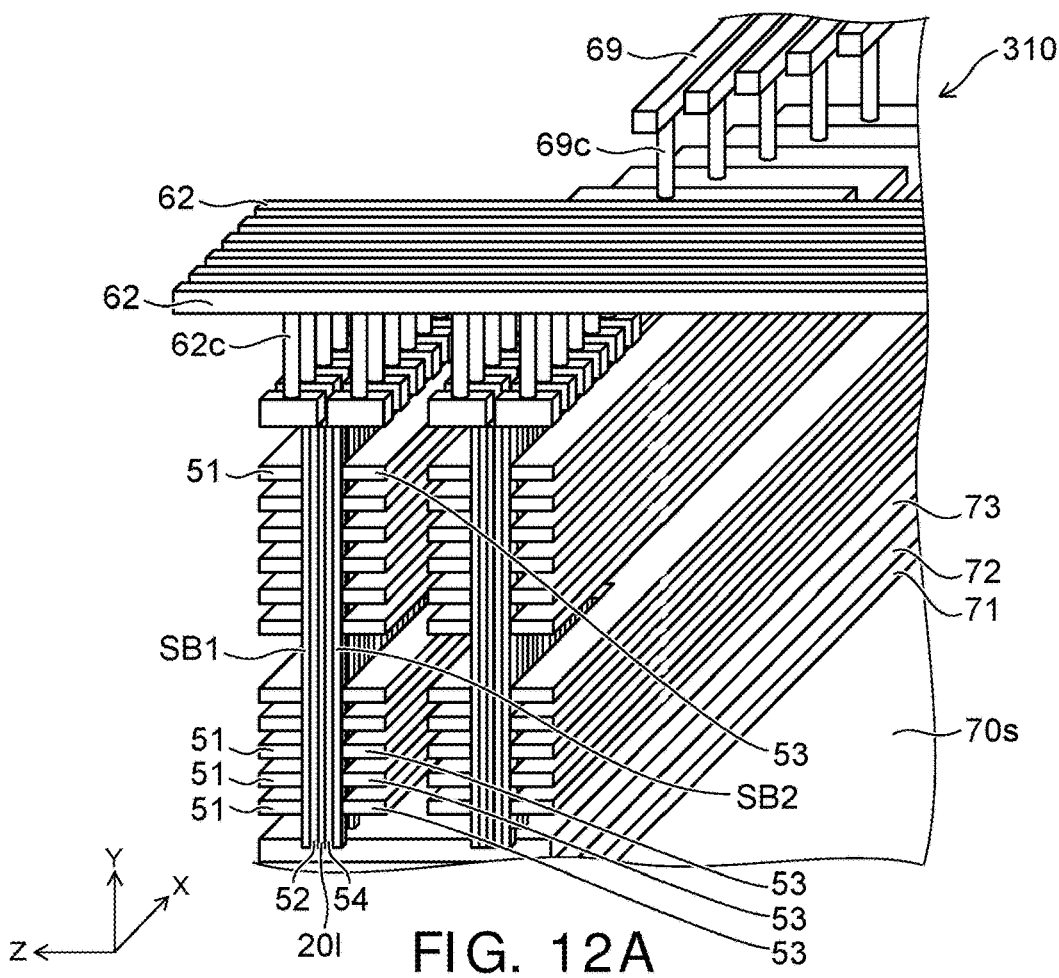
FIG. 12A and FIG. 12B are schematic views illustrating a memory device according to the second embodiment.
Figure 12B:
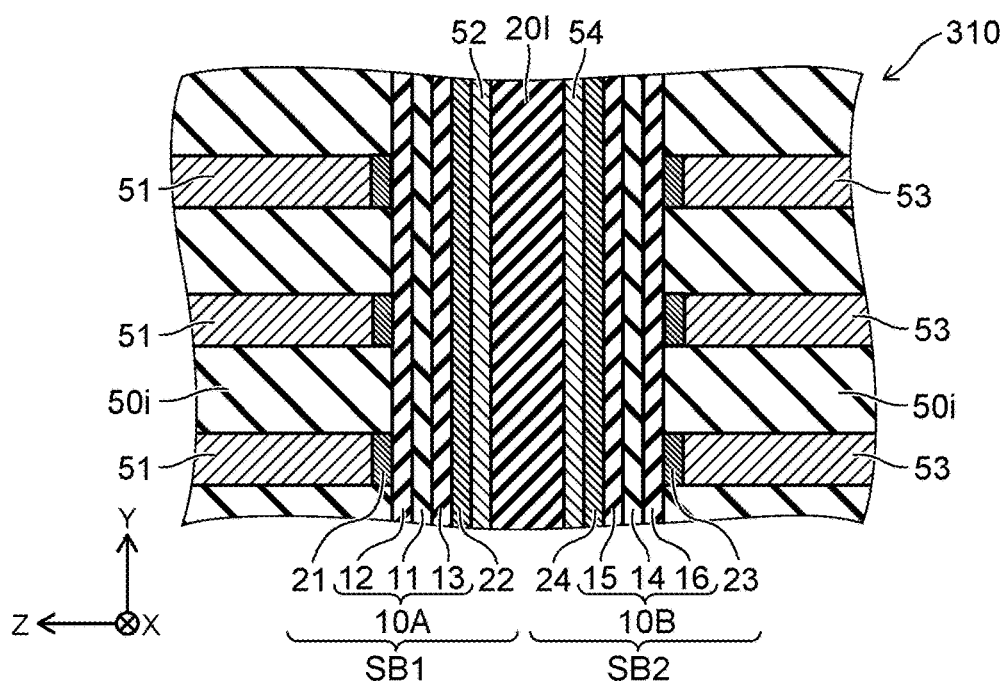

FIG. 12A and FIG. 12B are schematic views illustrating a memory device according to the second embodiment.

FIG. 12A is a perspective view. FIG. 12B is a cross-sectional view of a portion of FIG. 12A. In these drawings, at least a portion of the insulating portions is not illustrated for easier viewing of the drawings.

As shown in FIG. 12A, the multiple first interconnects 51 are provided in the memory device 310. The multiple first interconnects 51 extend along the second direction crossing the first direction (the Z-axis direction). In the example, the second direction is aligned with the X-axis direction. The multiple first interconnects 51 are separated from each other in the third direction crossing the plane including the first direction and the second direction. In the example, the third direction is the Y-axis direction.

The second interconnect 52 extends along the third direction (in the example, the Y-axis direction). The first stacked body SB1 is provided between the second interconnect 52 and one of the multiple first interconnects 51.

As shown in FIG. 12B, the first stacked body SB1 includes a portion overlapping one of the multiple first interconnects 51 in the first direction (the Z-axis direction), and a portion overlapping another one of the multiple first interconnects 51 in the first direction. Further, the first stacked body SB1 includes a portion overlapping, in the first direction, a region between the one of the multiple first interconnects 51 recited above and the other one of the multiple first interconnects 51 recited above. For example, in the first stacked body SB1, an insulating portion 50i is provided between the one of the multiple first interconnects 51 recited above and the other one of the multiple first interconnects 51 recited above. For example, the first stacked body SB1 overlaps the insulating portion 50i in the first direction (the Z-axis direction).

For example, the first layer 10A is provided between the second interconnect 52 and one of the multiple first interconnects 51 and between the second interconnect 52 and another one of the multiple first interconnects 51. For example, the first layer 10A may be further provided between the second interconnect 52 and the region (e.g., the insulating portion 50i) between the one of the multiple first interconnects 51 and the other one of the multiple first interconnects 51.

In the example, the first interconnect 51 may be the first conductive layer 21. The second interconnect 52 may be the second conductive layer 22. For example, the first layer 10A may be provided between the second conductive layer 22 and one of the multiple first conductive layers 21 and between the second conductive layer 22 and another one of the multiple first conductive layers 21. For example, the first layer 10A may be further provided between the second conductive layer 22 and the region (e.g., the insulating portion 50i) between the one of the multiple first conductive layers 21 and the other one of the multiple first conductive layers 21.

For example, the second interconnect 52 and the first stacked body SB1 are used as one columnar member. The columnar member extends along the Y-axis direction. Multiple columnar members are arranged in the X-axis direction.

As shown in FIG. 12A, the memory device 310 further includes multiple third interconnects 53, a fourth interconnect 54, and a second stacked body SB2. The direction from one of the multiple third interconnects 53 toward the fourth interconnect 54 is aligned with the first direction (the Z-axis direction).

The second stacked body SB2 is provided between the fourth interconnect 54 and one of the multiple third interconnects 53. For example, the second stacked body SB2 is provided between the fourth interconnect 54 and each of the multiple third interconnects 53.

The multiple third interconnects 53 extend along the second direction (e.g., the X-axis direction). The multiple third interconnects 53 are separated from each other in the third direction (e.g., the Y-axis direction). The fourth interconnect 54 extends along the third direction (e.g., the Y-axis direction).

In the example, the direction from one of the multiple first interconnects 51 toward one of the multiple third interconnects 53 is aligned with the Z-axis direction. For example, the multiple first interconnects 51 and the multiple third interconnects 53 are respectively separated from each other along the Z-axis direction.

A portion of the second interconnect 52 is provided between one of the multiple third interconnects 53 and one of the multiple first interconnects 51. A portion of the fourth interconnect 54 is provided between the portion of the second interconnect 52 recited above and the one of the multiple third interconnects 53 recited above.

For example, the fourth interconnect 54 and the second stacked body SB2 are used as another one columnar member. The other one columnar member extends along the Y-axis direction. Multiple columnar members are arranged in the X-axis direction. The columnar member that includes the second interconnect 52 and the first stacked body SB1 and the columnar member that includes the fourth interconnect 54 and the second stacked body SB2 may be formed as one body. An insulating portion 201 may be provided between the second interconnect 52 and the fourth interconnect 54.

A base body 70s is provided in the example. A silicon oxide film 71 is provided on the base body 70s. An interlayer insulating film 72 and a conductive film 73 are provided on the silicon oxide film 71. Ends of the second interconnect 52 and the fourth interconnect 54 each are electrically connected to the conductive film 73. Other ends of the second interconnect 52 and the fourth interconnect 54 each are electrically connected to one of multiple bit lines 62 via connection portions 62c. The multiple first interconnects 51 and the multiple third interconnects 53 each are electrically connected to one of multiple word lines 69 via a connection portion 69c. For example, the multiple bit lines 62 and the multiple word lines 69 are electrically connected to a controller (not illustrated).

The configurations (and the materials) of the first interconnect 51, the second interconnect 52, and the first stacked body SB1 are applicable respectively to the third interconnect 53, the fourth interconnect 54, and the second stacked body SB2. The second stacked body SB2 that is between one of the multiple third interconnects 53 and one of the multiple fourth interconnects 54 functions as one of the multiple memory cells.

As shown in FIG. 12B, the second stacked body SB2 includes a third conductive layer 23, a fourth conductive layer 24, and a second layer 10B. The direction from the third conductive layer 23 toward the fourth conductive layer 24 is aligned with the first direction (the Z-axis direction); and the second layer 10B is provided between the third conductive layer 23 and the fourth conductive layer 24.

The second layer 10B includes fourth to sixth regions 14 to 16. The fourth region 14 includes titanium and oxygen. The fifth region 15 is provided between the third conductive layer 23 and the fourth region 14 and includes aluminum and oxygen. The sixth region 16 is provided between the fourth region 14 and the fourth conductive layer 24 and includes aluminum and oxygen.

The configurations of the first conductive layer 21, the second conductive layer 22, and the first layer 10A are applicable respectively to the third conductive layer 23, the fourth conductive layer 24, and the second layer 10B.

For example, the surface area in a second plane (the X-Y plane) crossing the first direction of the brookite region included in the fourth region 14 is 58 percent or more of the surface area in the second plane recited above for the fourth region 14. The former may be 59 percent or more of the latter.

For example, the surface area in the second plane (the X-Y plane) recited above for the brookite region included in the fourth region 14 is not less than 1.4 times the surface area in the second plane recited above for the rutile region included in the fourth region 14. For example, the surface area recited above for the brookite region included in the fourth region 14 is greater than the surface area in the second plane (the X-Y plane) recited above for the anatase region included in the fourth region 14.

For example, the surface area in the second plane (the X-Y plane) recited above for the rutile region included in the fourth region 14 is greater than the surface area in the second plane recited above for the anatase region included in the fourth region 14.

For example, the set breakdown can be suppressed for the second stacked body SB2 as well.

According to the embodiments, a memory device can be provided in which the operations can be stable.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in memory devices such as conductive layers, intermediate layers, compound regions, interconnects, circuit parts, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all memory devices practicable by an appropriate design modification by one skilled in the art based on the memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A memory device, comprising:
a first conductive layer;
a second conductive layer, a direction from the first conductive layer toward the second conductive layer being aligned with a first direction; and
a first layer provided between the first conductive layer and the second conductive layer,
the first layer including
a first region including titanium and oxygen,
a second region including aluminum and oxygen and being provided between the first conductive layer and the first region, and
a third region including aluminum and oxygen and being provided between the first region and the second conductive layer,
a surface area in a first plane of a brookite region included in the first region being 58 percent or more of a surface area in the first plane of the first region, the first plane crossing the first direction.

2. The device according to claim 1, wherein the surface area of the brookite region included in the first region is 59 percent or more of the surface area of the first region.

3. The device according to claim 1, wherein
the second region further includes titanium,
the third region further includes titanium, and
a concentration of titanium in the third region is higher than a concentration of titanium in the second region.

4. The device according to claim 1, wherein
in analysis using transmission electron microscopy-electron energy-loss spectroscopy in the first direction, an intensity of titanium in at least a portion of the second region is lower than an intensity of aluminum in the at least a portion of the second region, and
in the analysis, an intensity of titanium in at least a portion of the third region is higher than an intensity of aluminum in the at least a portion of the third region.

5. The device according to claim 4, wherein in the analysis, an intensity of oxygen in the third region is higher than an intensity of oxygen in the first region.

6. The device according to claim 5, wherein in the analysis, an intensity of oxygen in the second region is higher than the intensity of oxygen in the first region.

7. The device according to claim 1, wherein
the first conductive layer extends along a second direction crossing the first direction, and
the second conductive layer extends along a third direction crossing a first plane including the first direction and the second direction.

8. The device according to claim 7, wherein
a plurality of the first layers is provided,
a plurality of the first conductive layers is provided,
the first conductive layers are arranged along the third direction,
a plurality of the second conductive layers is provided,
the second conductive layers are arranged along the second direction, and
one of the plurality of first layers is provided between one of the plurality of first conductive layers and one of the plurality of second conductive layers.

9. The device according to claim 1, further comprising:
a first interconnect; and
a second interconnect,
the first interconnect extending along a second direction crossing the first direction,
the second interconnect extending along a third direction crossing a first plane including the first direction and the second direction,
a first stacked body including the first conductive layer, the first layer, and the second conductive layer and being provided between the first interconnect and the second interconnect.

10. The device according to claim 9, wherein
a plurality of the first interconnects is provided,
the plurality of first interconnects extends along the second direction,
the plurality of first interconnects is mutually-separated in the third direction,
the second interconnect extends along the third direction, and
the first layer is provided between the second interconnect and one of the plurality of first interconnects and between the second interconnect and an other one of the plurality of first interconnects.

11. The device according to claim 10, wherein the first layer is further provided between the second interconnect and a region, the region being between the one of the plurality of first interconnects and the other one of the plurality of first interconnects.

12. The device according to claim 10, further comprising:
a plurality of third interconnects;
a fourth interconnect; and
a second stacked body,
the plurality of third interconnects extending along the second direction,
the plurality of third interconnects being mutually-separated in the third direction,
the fourth interconnect extending along the third direction,
a portion of the second interconnect being provided between one of the plurality of third interconnects and the one of the plurality of first interconnects,
a portion of the fourth interconnect being provided between the portion of the second interconnect and the one of the plurality of third interconnects,
the second stacked body being provided between the fourth interconnect and the one of the plurality of third interconnects.

13. The device according to claim 12, wherein
the second stacked body includes:
a third conductive layer;
a fourth conductive layer, a direction from the third conductive layer toward the fourth conductive layer being aligned with the first direction; and
a second layer provided between the third conductive layer and the fourth conductive layer,
the second layer includes:
a fourth region including titanium and oxygen;
a fifth region including aluminum and oxygen and being provided between the third conductive layer and the fourth region; and
a sixth region including aluminum and oxygen and being provided between the fourth region and the fourth conductive layer, and
a surface area in a second plane of a brookite region included in the fourth region is 58 percent or more of a surface area in the second plane of the fourth region, the second plane crossing the first direction.

14. The device according to claim 1, wherein an average grain size in the first region is 90 nm or more.

15. A memory device, comprising:
a first conductive layer;
a second conductive layer, a direction from the first conductive layer toward the second conductive layer being aligned with a first direction; and
a first layer provided between the first conductive layer and the second conductive layer,
the first layer including
a first region including titanium and oxygen,
a second region including aluminum and oxygen and being provided between the first conductive layer and the first region, and
a third region including aluminum and oxygen and being provided between the first region and the second conductive layer,
a surface area in a first plane of a brookite region included in the first region being not less than 1.4 times a surface area in the first plane of a rutile region included in the first region, the first plane crossing the first direction,
the surface area of the brookite region included in the first region being greater than a surface area in the first plane of an anatase region included in the first region.

16. The device according to claim 15, wherein the surface area in the first plane of the rutile region included in the first region is greater than the surface area in the first plane of the anatase region included in the first region.

17. The device according to claim 15, wherein the surface area of the brookite region included in the first region is not less than 1.45 times the surface area of the rutile region included in the first region.

18. A memory device, comprising a plurality of stacked bodies,
one of the plurality of stacked bodies including:
a first conductive layer;
a second conductive layer, a direction from the first conductive layer toward the second conductive layer being aligned with a first direction; and
a first layer provided between the first conductive layer and the second conductive layer,
the first layer including:
a first region including titanium and oxygen;
a second region including aluminum and oxygen and being provided between the first conductive layer and the first region; and
a third region including aluminum and oxygen and being provided between the first region and the second conductive layer,
for half or more of the stacked bodies of the plurality of stacked bodies, a surface area in a first plane of a brookite region included in the first region being 58 percent or more of a surface area in the first plane of the first region, the first plane crossing the first direction.

* * * * *